United States Patent
Kang et al.

(10) Patent No.: US 10,748,930 B2
(45) Date of Patent: Aug. 18, 2020

(54) MULTI-LEVEL FERROELECTRIC MEMORY DEVICE AND METHOD OF MANUFACTURING THE SAME

(71) Applicant: SK hynix Inc., Gyeonggi-do (KR)

(72) Inventors: Se Hun Kang, Gyeonggi-do (KR); Deok Sin Kil, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 49 days.

(21) Appl. No.: 15/917,346

(22) Filed: Mar. 9, 2018

(65) Prior Publication Data

US 2018/0197879 A1  Jul. 12, 2018

Related U.S. Application Data

(63) Continuation of application No. 15/183,232, filed on Jun. 15, 2016, now Pat. No. 9,954,000.

(30) Foreign Application Priority Data

Feb. 26, 2016  (KR) .................. 10-2016-0023543

(51) Int. Cl.
| | | |
|---|---|---|
| H01L 27/11585 | (2017.01) | |
| H01L 29/51 | (2006.01) | |
| H01L 29/66 | (2006.01) | |
| H01L 21/28 | (2006.01) | |
| H01L 27/1159 | (2017.01) | |
| H01L 29/78 | (2006.01) | |

(52) U.S. Cl.
CPC .... H01L 27/11585 (2013.01); H01L 27/1159 (2013.01); H01L 29/40111 (2019.08); H01L 29/516 (2013.01); H01L 29/6684 (2013.01); H01L 29/78391 (2014.09)

(58) Field of Classification Search
None
See application file for complete search history.

(56) References Cited

U.S. PATENT DOCUMENTS

| | | | |
|---|---|---|---|
| 5,796,143 A | 8/1998 | Fulford, Jr. et al. | |
| 5,953,602 A | 9/1999 | Oh et al. | |
| 6,222,230 B1 | 4/2001 | Gardner et al. | |
| 2004/0026784 A1 | 2/2004 | O'Kane et al. | |
| 2006/0091458 A1* | 5/2006 | Kim .................. | H01L 29/66833 257/330 |
| 2007/0120182 A1* | 5/2007 | Rouh .................. | H01L 29/1041 257/330 |

(Continued)

OTHER PUBLICATIONS

Muller et al., "Ferroelectricity in simple binary ZrO2 and HfO2", Nano Lett. 2012, 12, 4318-4323 (Year: 2012).*

(Continued)

*Primary Examiner* — Vincent Wall
(74) *Attorney, Agent, or Firm* — IP & T Group LLP

(57) ABSTRACT

A ferroelectric memory device may include a semiconductor substrate, a plurality of ferroelectric layers, a source, a drain and a gate. The semiconductor substrate may have a recess. The ferroelectric layers may be formed in the recess. The source may be arranged at a first side of the recess. The drain may be arranged at a second side of the recess opposite to the first side. The gate may be arranged on the ferroelectric layers. The ferroelectric layers may be polarized by different electric fields.

4 Claims, 5 Drawing Sheets

(56) References Cited

U.S. PATENT DOCUMENTS

2014/0138753 A1* 5/2014 Ramaswamy .... H01L 29/40111
257/295
2016/0181259 A1* 6/2016 Van Houdt ......... H01L 27/1159
365/145

OTHER PUBLICATIONS

Polakowski et al., "ferroelectricity in undoped hafnium oxide", Appl. Phys. Lett. 106, 232905 (2015) (Year: 2015).*
Lee et al., Resistance switching of the nonstoichiometric zirconium oxide for nonvolatile memory applications (Year: 2005).*
Nayak et al., "wet and dry etching", http://web.ece.ucdavis.edu/-anayakpr/Papers/Wet%20and%20Dry%20%20Etching_submitted. pdf, cite :https ://web .archive.org/web/20 150105150730/http ://web .ece .ucdavis .edu/ -anayakpr /Papers/Wet%20and %20 Dry% 20Etching_submitted.pdf, Jan. 5, 2015. (Year: 2015).
Office Action issued by USPTO for another application, U.S. Appl. No. 15/917,369 in the same family tree dated Oct. 18, 2018.

* cited by examiner

MULTI-LEVEL FERROELECTRIC MEMORY DEVICE AND METHOD OF MANUFACTURING THE SAME

CROSS-REFERENCES TO RELATED APPLICATION

This application is a continuation of U.S. patent application Ser. No. 15/183,232 filed on Jun. 15, 2016, which claims priority under 35 U.S.C. § 119(a) to Korean application number 10-2016-0023543, filed on Feb. 26, 2016. The disclosure of each of the foregoing applications is herein incorporated by reference in its entirety.

BACKGROUND

1. Technical Field

Various embodiments generally relate to a non-volatile memory device and a method of manufacturing the same, more particularly, to a multi-level ferroelectric memory device and a method of manufacturing the multi-level ferroelectric memory device.

2. Related Art

Recently, a non-volatile memory device having a high integration degree and a massive storage capacity are widely used. The non-volatile memory device may include a flash memory device used in portable electronic devices. However, a non-volatile memory device having improved operational capacity, which applies random access, are also being widely developed. Such a non-volatile memory device may include, for example, a ferroelectric RAM (FeRAM) using a ferroelectric capacitor, a magnetic RAM (MRAM) using a tunneling magneto-resistive (TMR) layer, a phase-changeable memory device using chalcogenide alloys, a resistive RAM (ReRAM) using a resistive layer as a data storage medium, etc.

The FeRAM may use a ferroelectric material as a storage medium. The ferroelectric material may have a spontaneous polarization characteristic. A spontaneous polarization direction of the ferroelectric material may be controlled by an electric field. When a voltage or an electric field may be applied to the ferroelectric material, the ferroelectric material may be polarized in accordance with the spontaneous polarization characteristic so that the FeRAM may perform memory operations.

SUMMARY

According to an embodiment, there may be provided a ferroelectric memory device. The ferroelectric memory device may include a semiconductor substrate, a plurality of ferroelectric layers, a source, a drain and a gate. The semiconductor substrate may have a recess. The ferroelectric layers may be formed in the recess. Electric Field levels at which the ferroelectric layers are polarized, are different from each other. The source may be arranged at a first side of the recess. The drain may be arranged at a second side of the recess opposite to the first side. The gate may be arranged over the ferroelectric layers.

According to an embodiment, there may be provided a ferroelectric memory device. The ferroelectric memory device may include a semiconductor substrate, a storage member, a source, a drain and a gate. The storage member may be formed in the semiconductor substrate. The source and the drain may be formed in the semiconductor substrate at both sides of the storage member. The gate may be arranged on the storing member. The storing member may include a plurality of ferroelectric layers. Electric fields levels at which the ferroelectric layers are polarized, are different from each other.

According to an embodiment, there may be provided a method of manufacturing a ferroelectric memory device. In the method of manufacturing the ferroelectric memory device, impurities may be implanted into a semiconductor substrate. The semiconductor substrate may be etched to form a recess, thereby defining a source and a drain doped with the impurities. A first ferroelectric layer may be formed over a sidewall of the recess. A second ferroelectric layer may be formed over the first ferroelectric layer to fill up the recess. A gate may be formed over the first and second ferroelectric layers.

According to an embodiment, there may be provided a ferroelectric memory device. The ferroelectric memory device may include a source, a drain, a multi-layered ferroelectric layer and a gate. The multi-layered ferroelectric layer may be provided in a trench provided between the source and the drain. The gate may be provided over the multi-layered ferroelectric layer and between the source and the drain.

DETAILED DESCRIPTION

Figure 1:
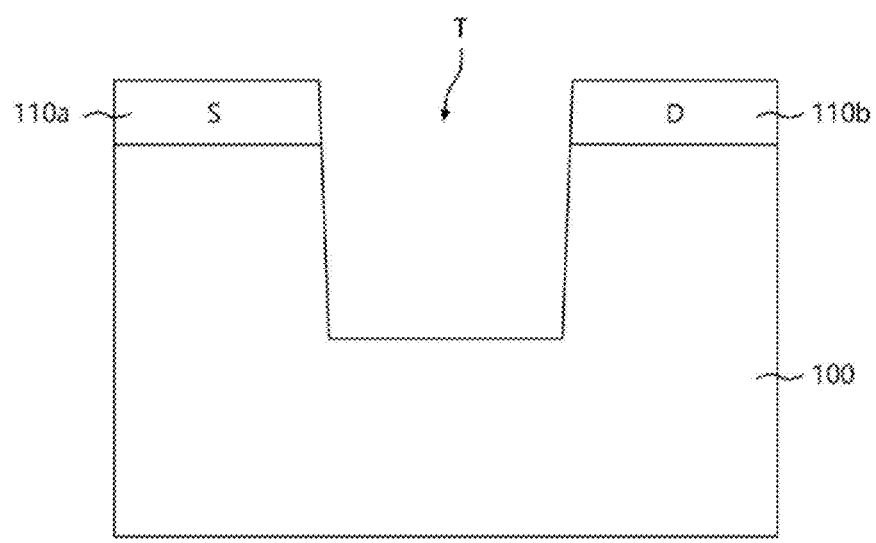
FIGS. 1 to 6 are cross-sectional views illustrating a method of manufacturing a ferroelectric memory device in accordance with an embodiment.

Various example embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented for example, rotated 90 degrees or at other orientations, and the spatially relative descriptors used herein should be interpreted accordingly.

The terminology used herein is for the purpose of describing particular examples of embodiments only and is not intended to be limiting the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms, used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be described with reference to the accompanying drawings.

FIGS. 1 to 6 are cross-sectional views illustrating a method of manufacturing a ferroelectric memory device in accordance with an embodiment. Referring to FIG. 1, a semiconductor substrate 100 may be prepared. The semiconductor substrate 100 may include a semiconductor material, such as, Si, SiGe, etc. Impurities may be implanted into the semiconductor substrate 100 to form junction regions such as a source and a drain. The impurity regions may include N type impurities having a high concentration, such as, P (phosphorus), As (arsenic), etc. Alternatively, when a PMOS transistor may be formed, the impurity regions may include P type impurities such as B(boron), etc. Further, the impurities in the source may be different from the impurities in the drain.

The semiconductor substrate 100 having the impurity regions may be etched to form a recess T. The recess T may be formed by an anisotropic etching process, an isotropic etching process, etc. In this example embodiment, the recess T having a trench shape may be formed by the anisotropic etching process. Alternatively, the recess T may have other shapes and may be formed by other processes. The impurity regions may be divided into the source 110a and the drain 110b by the recess T. A channel region may have a relatively long length compared to a planar type channel region by forming the recess T between the source 110a and the drain 110b.

Figure 2:
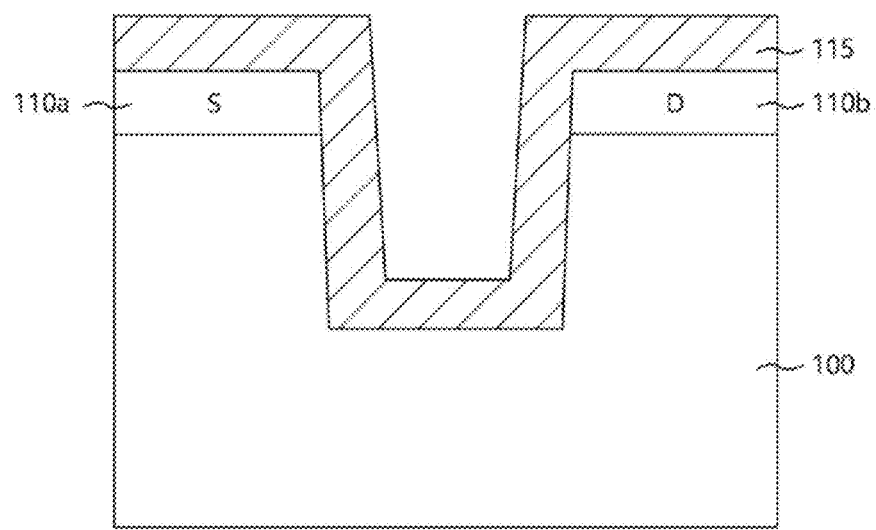

Referring to FIG. 2, a first ferroelectric layer 115 may be formed on a resultant structure of the semiconductor substrate 100. The first ferroelectric layer 115 may be formed by an atomic layer deposition (ALD) process. The first ferroelectric layer 115 may include a dielectric material showing switchable polarizations upon application of a first external electric field. The first external electric field may be provided from a gate formed later.

The first ferroelectric layer 115 may include a metal oxide layer having ferroelectricity such as a hafnium oxide ($Hf_xO_y$) layer, a zirconium oxide ($Zr_xO_y$) layer, etc. Alternatively, the first ferroelectric layer 115 may include a hafnium zirconium oxide ($Hf_xZr_yO_z$) layer, where each of x, y, and z may be a positive integer. The first ferroelectric layer 115 may be doped with impurities such as Si, Gd, Al, Y, Sr, La, etc. Alternatively, the first ferroelectric layer 115 may include PZT [$Pb(Zr_xTi_{1-x})O_3$], $0 \leq x \leq 1$, SBT($SrBi_2Ta_2O_9$), etc.

Figure 3:
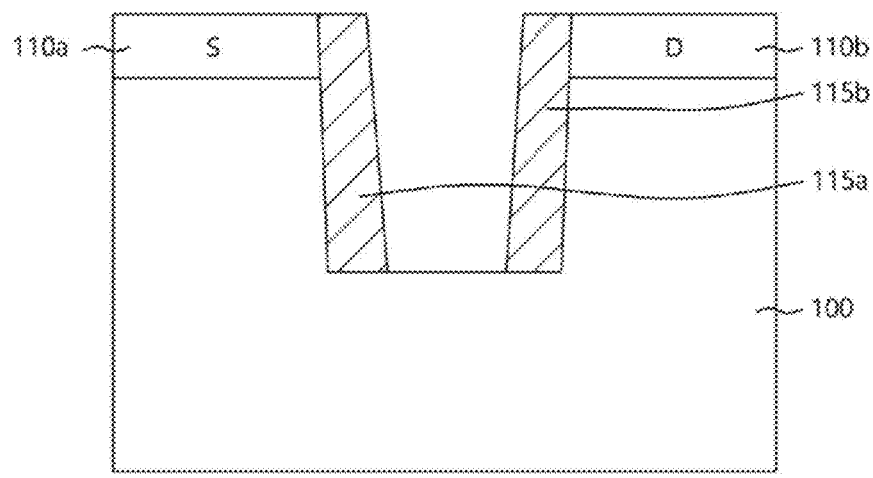

Referring to FIG. 3, the first ferroelectric layer 115 may be anisotropically etched. The etched first ferroelectric layer 115 may remain in the recess T. For example, the first ferroelectric layer 115 may be anisotropically etched until surfaces of the source 110a and the drain 110b may be exposed to form first ferroelectric patterns 115a, 115b. The first ferroelectric layer 115 may be configured to cover a sidewall of the recess T. In FIG. 3, the first ferroelectric layer 115 may include the pattern 115a on a first sidewall of the recess T and the pattern 115b on a second sidewall of the recess T opposite to the first sidewall. In another embodiment, the first ferroelectric patterns 115a, 115b are connected to each other and, in combination, may form a single body in an annular shape when viewed from the top.

Figure 4:
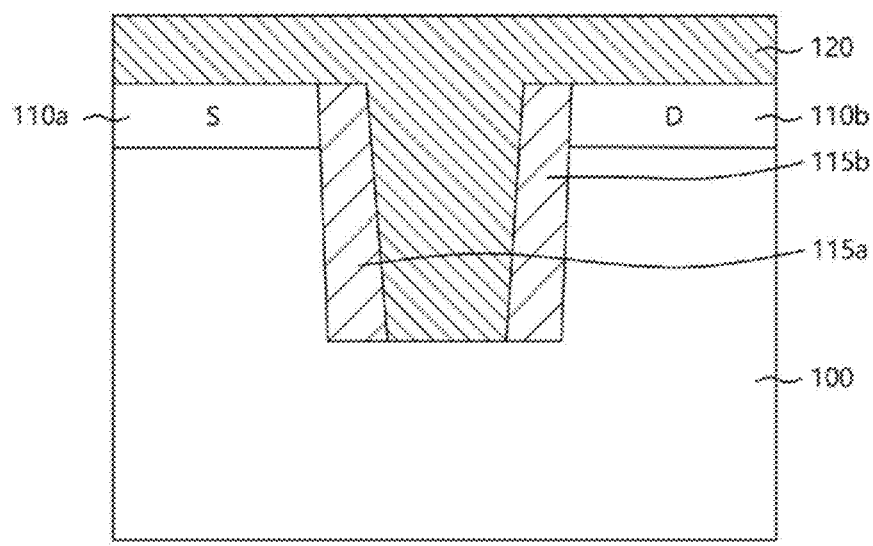

Referring to FIG. 4, a second ferroelectric layer 120 may be formed on the semiconductor substrate 100 and the first ferroelectric patterns 115a, 115b. The second ferroelectric layer 120 may have a thickness for filling up the recess T. The second ferroelectric layer 120 may include a dielectric material capable of showing switchable polarizations upon application of a second external electric field different from the first external electric field. The second ferroelectric layer 120 may include a dielectric material different from that of the first ferroelectric layer 115. Alternatively, the second ferroelectric layer 120 may include a dielectric material substantially the same as that of the first ferroelectric layer 115 except for a composition ratio.

Figure 5:
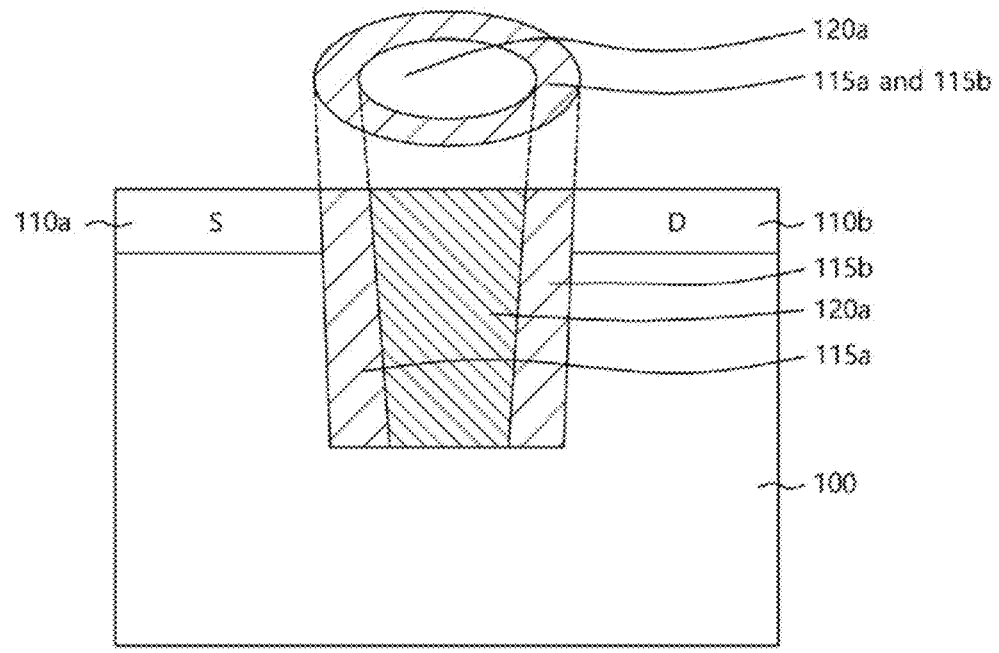

Referring to FIG. 5, the second ferroelectric layer 120 may be anisotropically etched until the surfaces of the source 110a and the drain 110b may be exposed to form a second ferroelectric pattern 120a in the recess T. Thus, the first ferroelectric pattern 115a and 115b and the second ferroelectric pattern 120a including different materials may be alternately stacked in the recess T. The second ferroelectric pattern 120a may be surrounded by the annular first dielectric pattern 115a and 115b.

Figure 6:
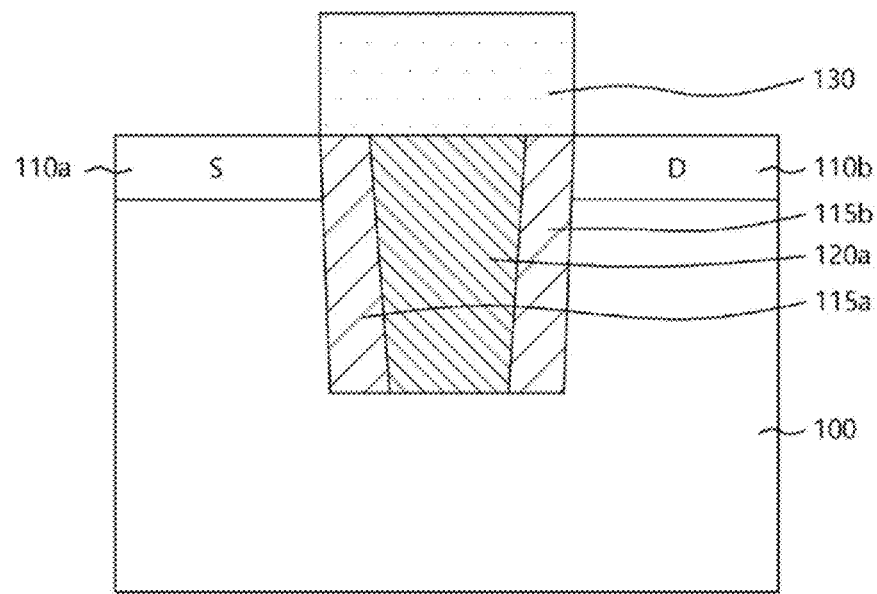
Figure 7:
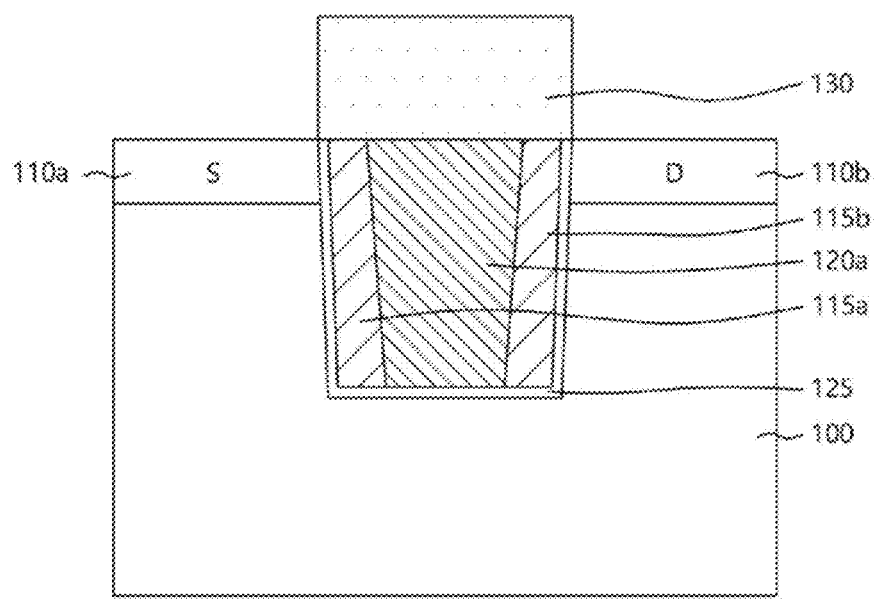
FIG. 7 is a cross-sectional view illustrating a ferroelectric memory device in accordance with an embodiment.

Referring to FIG. 6, a conductive layer may be formed on the semiconductor substrate 100. The conductive layer may be patterned to form a gate 130 on the first ferroelectric pattern 115a and 115b and the second ferroelectric pattern 120a. FIG. 7 is a cross-sectional view illustrating a ferroelectric memory device in accordance with an embodiment.

Referring to FIG. 7, a gate insulating layer 125 may be additionally formed between the semiconductor substrate 100 and the first ferroelectric pattern 115a, 115b and between the semiconductor substrate 100 and the second ferroelectric pattern 120a. The gate insulating layer 125 may include silicon oxide. The gate insulating layer 125 may be formed between the process for forming the recess T and the process for forming the first ferroelectric layer 115. The gate insulating layer 125 may improve electrical characteristics of the ferroelectric memory device.

According to example embodiments, the first ferroelectric pattern 115a and 115b and the second ferroelectric pattern 120 of the ferroelectric memory device may be polarized selectively or simultaneously by an electric field generated by a voltage difference between the gate and the drain or a word line and a bit line. The electric field may be changed by a voltage applied to the gate or the drain to obtain various resistance levels.

Figure 8:
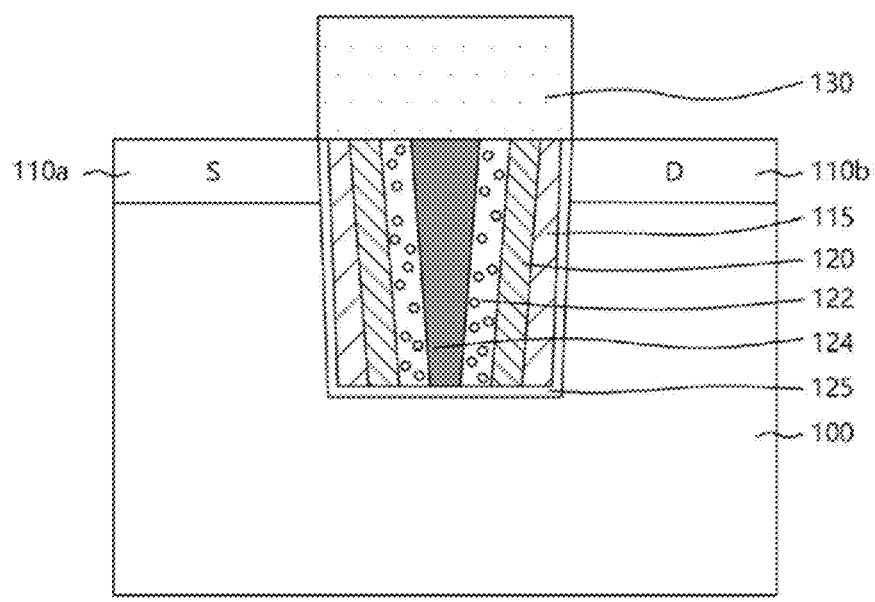
FIG. 8 is a cross-sectional view illustrating a ferroelectric memory device having four ferroelectric layers in accordance with an embodiment.
Figure 9:
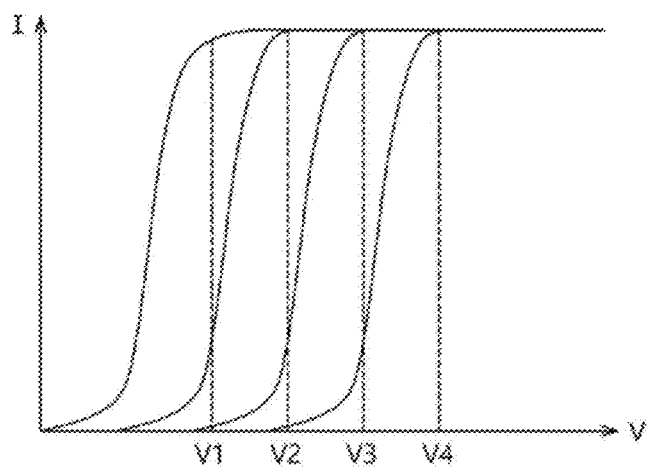
FIG. 9 is a graph illustrating a current-voltage characteristic of a ferroelectric memory device in accordance with an embodiment.

For example, when first to fourth ferroelectric layers including different materials may be applied to the gate insulating layer of the ferroelectric memory device, as shown in FIGS. 8 and 9, the four ferroelectric layers 115, 120, 122 and 124 may be polarized under different critical voltages V1, V2, V3 and V4. In this case, a polarization of the first ferroelectric layer, polarizations of the first and second ferroelectric layers, polarizations of the first to third ferroelectric layers, polarizations of the first to fourth ferroelectric layers, etc., may be generated to obtain various resistance levels.

According to example embodiments, the recess may be formed in the semiconductor substrate. The ferroelectric layers as the storage medium and the gate insulating layer may be formed in the recess. The ferroelectric layers may be polarized by different electric fields and have various resistance levels depending upon the number of the ferroelectric layers and polarization levels of the ferroelectric layers so that the multi-level ferroelectric memory device may be embodied.

In example embodiments, the ferroelectric memory device may include the first and second ferroelectric layers having the different polarization characteristics. Alternatively, the ferroelectric memory device may include at least three ferroelectric layers.

Figure 10:
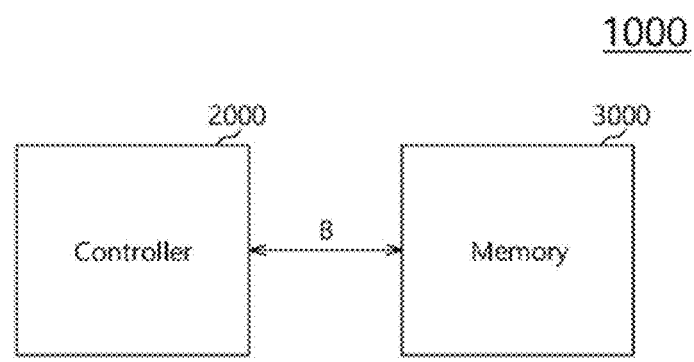
FIG. 10 is a schematic diagram illustrating a memory system according to an embodiment.

FIG. 10 is a schematic diagram illustrating a memory system according to an embodiment of the present disclosure. Referring to FIG. 10, a memory system 1000 may include a memory controller 2000 and a memory 3000. The memory 3000 may communicate with the memory controller 2000 through a bus line B. The bus line B may include a bus for transmitting addresses, data, commands, etc.

The memory 3000 may include the ferroelectric memory device according to an embodiment. The ferroelectric memory device may include the ferroelectric layers having different characteristics in the semiconductor substrate. Resistance values of the various voltage levels of the ferroelectric memory device may be changed by the ferroelectric layers. Thus, a multi-level ferroelectric memory device may be formed.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A resistive memory device comprising:
   a semiconductor substrate including a trench having a first depth;
   a gate insulating layer that lines the wall of the trench;
   a plurality of ferroelectric layers formed to fill the remaining entire space of the trench, as a storage member;
   a gate electrode formed on the plurality of ferroelectric layers, the gate electrode including a bottom surface in direct contact with upper surfaces of the plurality of the ferroelectric layers and an upper surface positioned above an upper surface of the semiconductor substrate; and
   junction regions formed in the semiconductor substrate and at both sides of the gate electrode,
   wherein the upper surfaces of the plurality of the ferroelectric layers, upper surfaces of the junction regions, the upper surface of the gate insulating layer and the bottom surface of the gate electrode are coplanar.

2. The resistive memory device of claim 1, wherein the plurality of the ferroelectric layers comprise different materials from each other.

3. The resistive memory device of claim 1, wherein the plurality of the ferroelectric layers comprise substantially the same materials as each other and have different composition ratios from each other.

4. The resistive memory device of claim 1, wherein each of the ferroelectric layers is formed to be parallel with a side wall of the trench.

* * * * *